US011276665B2

(12) United States Patent
Kim et al.

(10) Patent No.: US 11,276,665 B2
(45) Date of Patent: Mar. 15, 2022

(54) LASER REFLOW APPARATUS AND METHOD FOR ELECTRONIC COMPONENTS WITH MICRON-CLASS THICKNESS

(71) Applicant: LASERSSEL CO., LTD., Asan-si (KR)

(72) Inventors: Nam Seong Kim, Anyang-si (KR); Jae Joon Choi, Gwangju-si (KR)

(73) Assignee: LASERSSEL CO., LTD., Asan-si (KR)

( * ) Notice: Subject to any disclaimer, the term of this patent is extended or adjusted under 35 U.S.C. 154(b) by 50 days.

(21) Appl. No.: 16/546,600

(22) Filed: Aug. 21, 2019

(65) Prior Publication Data
US 2020/0091108 A1    Mar. 19, 2020

(30) Foreign Application Priority Data
Sep. 18, 2018  (KR) .................. 10-2018-0111572

(51) Int. Cl.
*B23K 26/03*    (2006.01)
*B23K 26/06*    (2014.01)
(Continued)

(52) U.S. Cl.
CPC ............ *H01L 24/81* (2013.01); *B23K 1/0056* (2013.01); *B23K 3/00* (2013.01); *B23K 26/0608* (2013.01);
(Continued)

(58) Field of Classification Search
CPC ...... B23K 1/005–0056; B23K 26/0613; B23K 26/06–0608; B23K 26/03–034; B23K 26/067–0676
See application file for complete search history.

(56) References Cited

U.S. PATENT DOCUMENTS 5,604,831 A  *  2/1997 Dittman ............... B23K 35/268
                                                                  385/88
5,705,788 A     1/1998 Beyer et al.
(Continued)

FOREIGN PATENT DOCUMENTS

CN          1863635 A       11/2006
CN       101295658 A       10/2008
(Continued)

OTHER PUBLICATIONS

Japanese Office Action dated Sep. 17, 2019, in connection with the Japanese Patent Application No. 2019-153010.
(Continued)

*Primary Examiner* — Michael A Laflame, Jr.
(74) *Attorney, Agent, or Firm* — Hauptman Ham, LLP

(57) ABSTRACT

Provided is a laser reflow apparatus for reflowing electronic components on a substrate disposed on a stage, the apparatus including: a laser emission unit comprised of a plurality of laser modules for emitting a laser beam having a flat top output profile in at least one section of the substrate on which the electronic components are disposed; a camera unit comprising at least one camera module for capturing a reflowing process of the electronic components performed by the laser beam; and a laser output control unit configured to generate a control signal for independently controlling the respective laser modules of the laser emission unit based on a signal output from the camera unit and apply the control signal to the laser emission unit.

5 Claims, 15 Drawing Sheets

(51) Int. Cl.
  *H01L 23/00*   (2006.01)
  *B23K 26/354*  (2014.01)
  *H01L 21/66*   (2006.01)
  *B23K 1/005*   (2006.01)
  *B23K 26/073*  (2006.01)
  *B23K 3/00*    (2006.01)
(52) U.S. Cl.
  CPC .......... *B23K 26/073* (2013.01); *B23K 26/354* (2015.10); *H01L 22/26* (2013.01); *H01L 24/75* (2013.01); *H01L 2224/7592* (2013.01); *H01L 2224/75263* (2013.01); *H01L 2224/81224* (2013.01); *H01L 2224/81815* (2013.01); *H01L 2224/81908* (2013.01)

(56) References Cited

U.S. PATENT DOCUMENTS

| | | | |
|---|---|---|---|
| 2003/0080099 | A1 | 5/2003 | Tanaka et al. |
| 2003/0153182 | A1 | 8/2003 | Yamazaki et al. |
| 2006/0021681 | A1 | 2/2006 | Yamada et al. |
| 2008/0057718 | A1* | 3/2008 | Omata ................ B23K 26/389 438/694 |
| 2008/0076267 | A1* | 3/2008 | Oishi ................ B23K 26/0676 438/785 |
| 2008/0318395 | A1* | 12/2008 | Farnworth .......... B23K 26/044 438/462 |

FOREIGN PATENT DOCUMENTS

| | | |
|---|---|---|
| DE | 4316829 A1 | 11/1994 |
| DE | 10136611 01 | 11/2002 |
| JP | H02-142695 A | 5/1990 |
| JP | 2010-046701 A | 3/2010 |
| JP | 2010-050344 A | 3/2010 |
| JP | 2013-103264 A | 5/2013 |
| JP | 2014-018800 A | 2/2014 |
| JP | 6608559 B1 | 11/2019 |
| KR | 10-2013-0112112 A | 10/2013 |
| KR | 10-2017-0140477 A | 12/2017 |
| KR | 10-2017-0141865 A | 12/2017 |
| WO | 2015072598 A1 | 5/2015 |

OTHER PUBLICATIONS

Korean Office Action dated Oct. 2, 2019, in connection with the Korean Patent Application No. 10-2018-0111572.

Extended European Search Report dated Feb. 19, 2020 in connection with the counterpart European Patent Application No. EP19197845.1.

Chinese Office Action dated Feb. 9, 2021 in connection with the counterpart Chinese Patent Application No. 201910751038.5.

* cited by examiner

FIG. 7

LASER REFLOW APPARATUS AND METHOD FOR ELECTRONIC COMPONENTS WITH MICRON-CLASS THICKNESS

CROSS REFERENCE TO RELATED APPLICATION

This application claims the benefit of Korean Patent Application No. 10-2018-0111572 filed with the Korean Intellectual Property Office on Sep. 18, 2018, the disclosures of which are incorporated herein by reference.

TECHNICAL FIELD

Exemplary embodiments according to the present disclosure relate to a multi-laser reflow apparatus and method for electronic components having a micron-class thickness.

BACKGROUND ART

In industrial laser processing, micron (μm) laser processing is performed in micron-level precision, which is widely used in a variety of industries such as semiconductors, displays, printed circuit boards (PCB), and smartphones, etc. Memory chips used in all types of electronic devices had been developed to have minimal circuit intervals so as to achieve a high degree of integration and performance and high-speed communication. In recent times, however, it has become difficult to reach a desired level of technology solely by reducing circuit intervals and line intervals, and thus, memory chips tend to be vertically deposited these days. TSMC has developed a deposition technique for deposition up to 128 layers, while Samsung Electronics and SK Hynix, etc. are currently applying a technique for deposition up to 72 layers to mass production. Moreover, earnest research is being conducted on technology for mounting memory chips, micro-processor chips, graphic-processor chips, wireless processor chips, sensor processor chips, etc. on a single package, and such technology has already reached a considerably high level and is being employed in practice.

However, during the development of such technology, a cooling treatment issue has been raised regarding heat generation due to a large power consumption, as a greater number of electrons needs to participate in a signal processing process in high-speed/high-capacity semiconductor chips. In addition, to address the requirements of high-speed signal processing and high-frequency signal processing for a greater number of signals, there has been raised another technical issue of having to transfer a mass of electronic signals at high speed. Furthermore, due to a greater number of signal lines, signal interface lines external to semiconductor chips cannot be dealt with a primary lead-line scheme any more. For this reason, a ball grid array (BGA) method (also referred to as Fan-In BGA or Fan-in Wafer-Level-Package (FIWLP)), which is a secondary treatment performed underneath semiconductor chips, is being used. Alternatively, a Fan-Out BGA or Fan-Out Wafer-Level-Package (FOWLP) or Fan-Out Panel-Level-Package method may be used, which is to provide a signal layout redistribution layer being underneath a ultra-fine BGA layer below semiconductor chips and underneath it, having a secondary fine BGA layer, is being used.

According to recent technology, semiconductors having an epoxy-mold compound layer with a thickness of 200 μm are being introduced. When using a mass reflow (MR) process such as a thermal reflow oven technique, which is a standard process of traditional surface mounting technology (SMT) to attach an ultra-thin semiconductor chip of micron size with a thickness of only hundreds of microns, the semiconductor chip would be exposed to the temperature of 100-300° C. for hundreds of seconds. Thus, due to a difference in coefficients of thermal expansion (CTE), various soldering bonding defects may occur, such as chip-boundary warpage, PCB-boundary warpage, and random-bonding failure by thermal shock.

Under the circumstances, to attach an ultra-thin semiconductor chip to an ultra-thin PCB, localized heating technology has been developed. For example, a BGA soldering technique by heating pad pressurization and a BGA soldering technique by absorption heating using square laser beam irradiation. A BGA soldering technique by heating pad pressurization has disadvantageous such as a large electricity consumption and having to maintain a heating pad at high temperature continuously. Moreover, since it is based on contact-based heat transfer, the following process needs to be performed at optimal conditions: solid heat transfer→heat absorption→secondary heat transfer→maintaining the temperature→non-thermal shock low-temperature cooling. However, to prevent chip damage by thermal shock that may occur due to a difference in coefficients of thermal expansion (CTE), the process rate cannot be increased, and thus, this technique has a drawback.

Meanwhile, a laser reflow (LR) process is advantageous in that it is a non-contact based technique, wherein laser light is directly absorbed by a semiconductor chip, which is a primary heat absorption mechanism, which allows the prevention of thermal shock occurring due to a difference in coefficients of thermal expansion (CTE). Additionally, since localized heating is performed only for a required period of time, it has benefits of low power consumption, and minimization in terms of total heat input, thermal shock and process time, etc.

However, a conventional laser reflow (LR) process suffers from plenty of problems when it is applied to a mass production mass area processing, which is recently required. Specifically, since a large area laser reflow process requires the same amount of laser output power per unit area as in a less area laser reflow process, a total amount of laser output power required for large area laser reflow would be exponentially increased, and to this end, high-output laser is needed.

However, such high-output laser requires high costs, and high-power supply for high average power. Furthermore, absorption power by neighboring devices due to scattering/diffusion should not be underestimated. Additionally, due to technical restrictions of beam homogenizers for homogenizing laser beam outputs, it is difficult to reduce the level of beam flatness more than approximately 10%. Accordingly, a loss of approximately 10% is inevitable in case laser processing is performed in accordance with a minimum output line within a beam flat area. To compete with conventional mass reflow (MR) process, a temperature deviation of the entire area of a large area substrate needs to be maintained below 3 to 4° C. even in the case of processing ultra-thin semiconductor chips on the large area substrate. However, this target temperature is substantially impossible to achieve.

Thus, due to the aforesaid disadvantages of laser reflow process, despite various drawbacks of mass reflow process, a laser reflow process still cannot substitute a mass reflow process. This phenomenon is remarkably observed in the fields of large-area processing technology or technology that requires high-output laser.

PRIOR ART REFERENCE

Patent Document (Patent document 0001) Korean Patent Application No. 10-2017-0141865 (published on Dec. 27, 2017)

DISCLOSURE OF INVENTION

Problem to be Solved by the Invention

Under the circumstances, the present disclosure has been suggested to provide a laser reflow apparatus and method capable of preventing various kinds of contact defects in soldering bonding, which are the disadvantageous of a mass reflow process, such as chip-boundary warpage, substrate-boundary warpage, random boding failure by thermal shock, etc.

The present disclosure provides a laser reflow apparatus and method capable of solving the problem of device damage by thermal shock and a consequent problem of a process slowing issue, which are the drawbacks of BGA soldering by a heating pad pressurization heating scheme.

The present disclosure provides a laser reflow apparatus and method capable of solving the problems occurring due to using high-cost, high-output power supply devices as high-output laser needs to be used in large area processing, and absorption power by neighboring devices, etc.

The present disclosure provides a laser reflow apparatus and method capable of solving the problem regarding beam flatness due to technical restrictions of a beam homogenization optical system and a subsequent laser output loss problem.

The present disclosure provides a laser reflow apparatus and method capable of maintaining a temperature deviation of the entire area of a large area substrate below 3 to 4° C. even in the case of processing ultra-thin semiconductor chips on the large area substrate, thereby completely substituting a conventional mass reflow (MR) process.

The present disclosure provides a laser reflow apparatus and method capable of simultaneously performing a reflow process at multiple locations by emitting a plurality of laser beams on respectively divided processed surfaces.

Means for Solving Problem

In order to achieve the aforementioned objectives, a laser reflow apparatus for reflowing electronic components on a substrate disposed on a stage, the apparatus includes: a laser emission unit comprised of a plurality of laser modules for emitting a laser beam having a flat top output profile in at least one section of the substrate on which the electronic components are disposed; a camera unit comprising at least one camera module for capturing a reflowing process of the electronic components performed by the laser beam; and a laser output control unit configured to generate a control signal for independently controlling the respective laser modules of the laser emission unit based on a signal output from the camera unit and apply the control signal to the laser emission unit.

According to an exemplary embodiment of the present disclosure, each of the laser modules may have an equal maximum output, and emits a laser beam equal in beam shape, beam area and emission area, such that the laser beams are superposed with one another.

According to an exemplary embodiment of the present disclosure, each laser beam may have an equal wavelength, and have a randomly occurring laser power peak variation at each location in the two-dimensional spatial beam profile, thereby causing flat superposition in terms of the spatial beam intensity to improve the flatness of the laser beams in a large portion of the emission area.

According to an exemplary embodiment of the present disclosure, the laser modules may be arranged in a symmetrical manner and have an equal beam emission angle.

According to an exemplary embodiment of the present disclosure, each of the laser modules may have an optical system provided therein, the optical system including: a beam shaper; at least one pair of cylindrical lenses; at least another pair of cylindrical lenses arranged perpendicularly to the at least one pair of cylindrical lenses; and a zoom lens module comprised of one or more of convex lenses and concave lenses.

According to an exemplary embodiment of the present disclosure, the cylindrical lens, etc. may be a cylindrical lens having a micro lens array (MLA) for a single axis.

According to another exemplary embodiment of the present disclosure, the laser beams emitted from each of the laser modules may be different from one another in at least one of beam shape, beam area and emission area.

According to another exemplary embodiment of the present disclosure, depending on application settings, some of the laser beams emitted from the respective laser modules are equal in beam shape, beam area and emission area, and thereby superposed with one another, and some other of the laser beams emitted from the respective laser modules are different from one another in at least one of beam shape, beam area and emission area.

In order to achieve the aforementioned objectives, a laser reflow method for reflowing electronic components on a substrate disposed on a stage by using a laser emission unit comprised of a plurality of laser modules, the method includes: emitting, by each of the plurality of laser modules, a laser beam to a section of the substrate on which the electronic components are disposed; capturing, by at least one camera module, a reflowing process of the electronic components performed by the laser beam; and generating a control signal for independently controlling each of the laser modules of the laser emission unit based on a signal output from the camera unit and applying the control signal to the laser emission unit.

According to an exemplary embodiment of the present disclosure, the emitting of a laser beam may include superposing the respective laser beams in a manner that each of the laser modules has an equal output, and each of the laser beams emits a laser beam equal in beam shape, beam area and emission area.

According to an exemplary embodiment of the present disclosure, each laser beam may have an equal wavelength, and have a randomly occurring laser power peak variation at each location in the two-dimensional spatial beam profile, thereby causing flat superposition in terms of the spatial beam intensity to improve the flatness of the laser beams in a large portion of the emission area. During the flat superposition, a minute output fluctuation for each location of the respective laser beams has a random laser power peak variation, and thus, when several laser beams are superposed with one another, the peak values for each location are added up to provide flatness thereby improving laser beam flatness.

Effect of the Invention

According one or more exemplary embodiments of the present disclosure, a selective laser reflow system for electronic components having a micron-class thickness has the following effects.

According one or more exemplary embodiments of the present disclosure, various soldering bonding defects, such as chip-boundary warpage, PCB-boundary warpage, and random-bonding failure by thermal shock, which are drawbacks of a mass reflow process, can be prevented.

According one or more exemplary embodiments of the present disclosure, the problem of device damage by thermal shock and a subsequent problem of a process slowing issue, which are the drawbacks of BGA soldering by a heating pad pressurization heating scheme, can be solved.

According one or more exemplary embodiments of the present disclosure, the problems occurring due to the use of high-cost, high-output power supply devices as high-output laser needs to be used in large area processing, and absorption power by neighboring devices, etc., can be solved.

According one or more exemplary embodiments of the present disclosure, a beam flatness issue due to technical restrictions of beam homogenizers for homogenizing laser beam outputs can be solved.

According one or more exemplary embodiments of the present disclosure, a temperature deviation in the entirety of a large area substrate can be maintained below 3 to 4° C. even in the case of processing ultra-thin semiconductor chips, and thus, completely substituting a conventional mass reflow process.

According one or more exemplary embodiments of the present disclosure, a power supply device and a cooling device can be stably operated, a total amount of power consumption can be reduced, and costs for purchasing equipment and storage can be lessened owing to lower manufacturing costs and less frequent breakdown, compared to using a single high-output laser beam.

According one or more exemplary embodiments of the present disclosure, due to spatial and temporal improvements in beam flatness, the temperature stability during a process can be increased, the amount of energy being input can be decreased, and even in the case of large area processing, the temperature stability requirements for a mass reflow chamber can be satisfied.

According one or more exemplary embodiments of the present disclosure, even in the case of a plurality of laser beams are emitted to a surface in an inclined manner, asymmetry caused by the inclination of the laser being emitted on the surface can be addressed or offset by symmetrically setting the direction of the respective laser beams being emitted.

According one or more exemplary embodiments of the present disclosure, a reflow process can be simultaneously performed at multiple locations by emitting a plurality of laser beams to respectively divided processed surfaces.

BRIEF DESCRIPTION OF DRAWINGS

FIG. 7 is a view illustrating the results of a laser beam output test corresponding to the laser beam output profile of FIG. 6.

BEST MODE(S) FOR CARRYING OUT THE INVENTION

Advantages and features of the present invention and methods for achieving them will be made clear from exemplary embodiments described below in detail with reference to the accompanying drawings. The terminology used herein is for the purpose of describing particular embodiments only and is not intended to be limiting. As used herein, the singular forms "a," "an," and "the" are intended to include the plural forms, including "at least one," unless the content clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein (including technical and scientific terms) have the same meaning as commonly understood by those skilled in the art. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, exemplary embodiments of the present disclosure will be described in detail with reference to the accompanied drawings.

Figure 1:
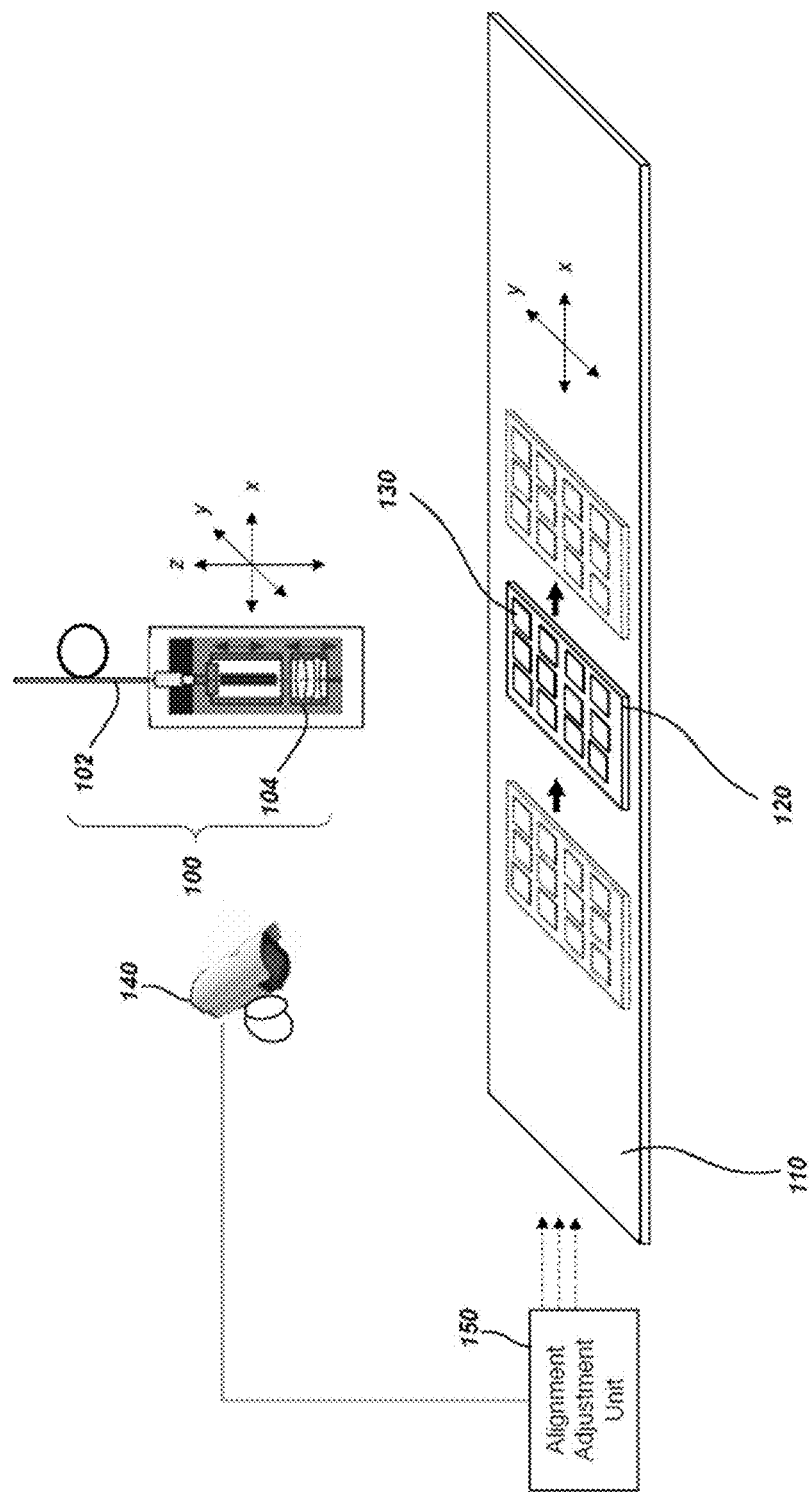
FIG. 1 is a view illustrating an example of a laser reflow apparatus according to related art.

FIG. 1 is a view illustrating an example of a laser reflow apparatus according to related art.

Referring to FIG. 1, the laser reflow apparatus is configured to bond an electronic component (130) using a laser beam from a laser module (100) to a substrate (120) disposed on a stage (110) which moves in the X axis direction.

An alignment state of the substrate (120) on which an electronic component (130), such as a semiconductor chip, is mounted is verified from an image captured by a camera module (140). In case of misalignment, a realignment is performed by an alignment adjustment unit (150) which moves the stage (110) in the X axis or Y axis direction.

A laser emission unit may be provided as a single laser module (100) including a laser source (102) having a single optical fiber and an optical system (104) for converting a laser beam from the laser source (102) to a laser beam having a predetermined intensity and shape.

When reflowing a substrate (120) having a large area on which multiple electronic components (130) are arranged, a laser beam having a rectangular or square shape is emitted toward the entire area of the substrate (120) by using the large-capacity, high-output laser module (100) as shown in FIG. 1. In this instance, laser beams having an equal intensity are emitted not only to the electronic components (130) but also to the areas of the substrate (120) in between the electronic components (130). Consequently, conductive heat from neighboring electronic components (130) as well as radiant heat of the laser beams are applied to the respective electronic components (130), thereby causing overheating throughout the electronic components. Since the thermal energy transmitted to the respective electronic components cannot be precisely controlled due to the conductive heat, it is difficult to lessen a temperature deviation throughout the substrate (120).

Figure 2:
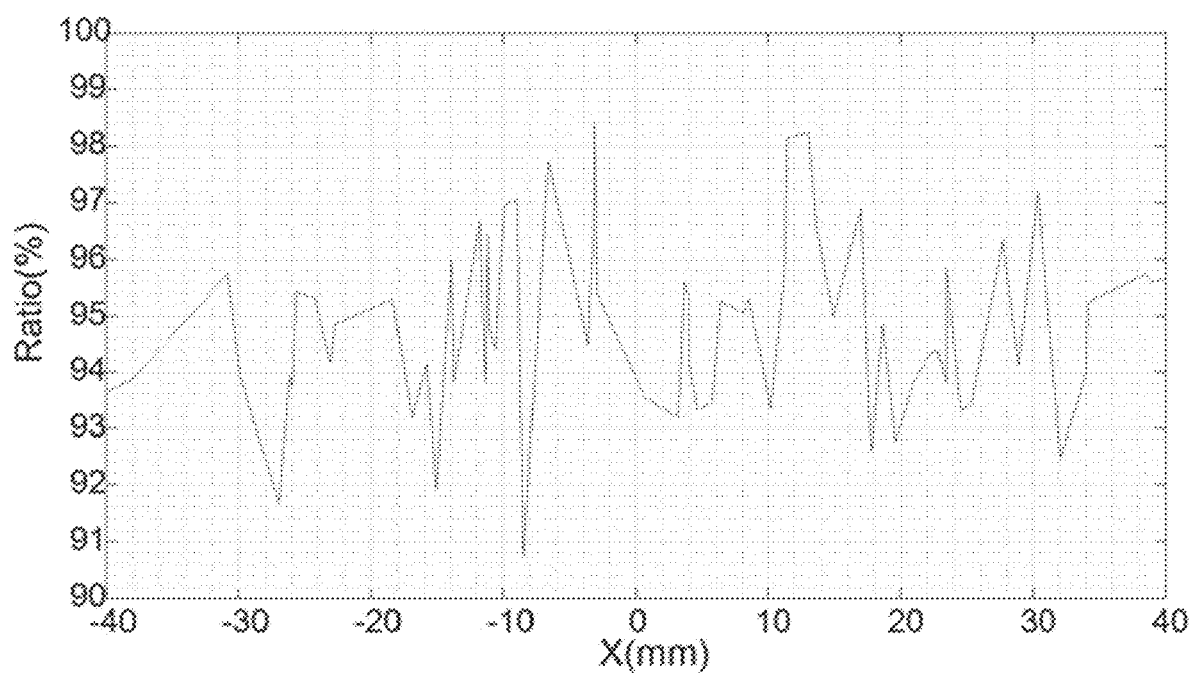
FIG. 2 is a view illustrating an example of a laser beam output profile of a laser reflow apparatus according to related art.

FIG. 2 is a view illustrating an example of a laser beam output profile of a laser reflow apparatus according to related art.

Referring to FIG. 2, a beam profile of a single laser beam according to related art shows an output deviation or ripple of approximately 8% at a top region of the laser beam profile thereby allowing for a homogeneous output. This is because it is difficult to provide a beam homogenizer having a completely flat top profile in practice.

For example, a laser module (100) of 10 kW output has a laser beam profile having a ripple with the peak of 800 W in a flat top region. Consequently, the homogeneity of the thermal energy applied to each portion of the electronic component may be decreased. Furthermore, due to the characteristics of the short wavelength of the laser beam, the thermal energy may not be uniformly transmitted throughout upper and lower portions of the electronic component, such that the energy may be concentrated on a section of the corresponding wavelength range that has a high absorption rate. Accordingly, a region that is not an actual bonding portion of the electronic component package may undergo a considerable energy loss.

To appropriately control the thermal energy applied to the electronic component, it is necessary to design a process to match the output level at a lower most portion of the electronic component, which is 9 kW. Therefore, beyond the level of 9 kW, there would be an inevitable waste of excess energy.

Figure 3:
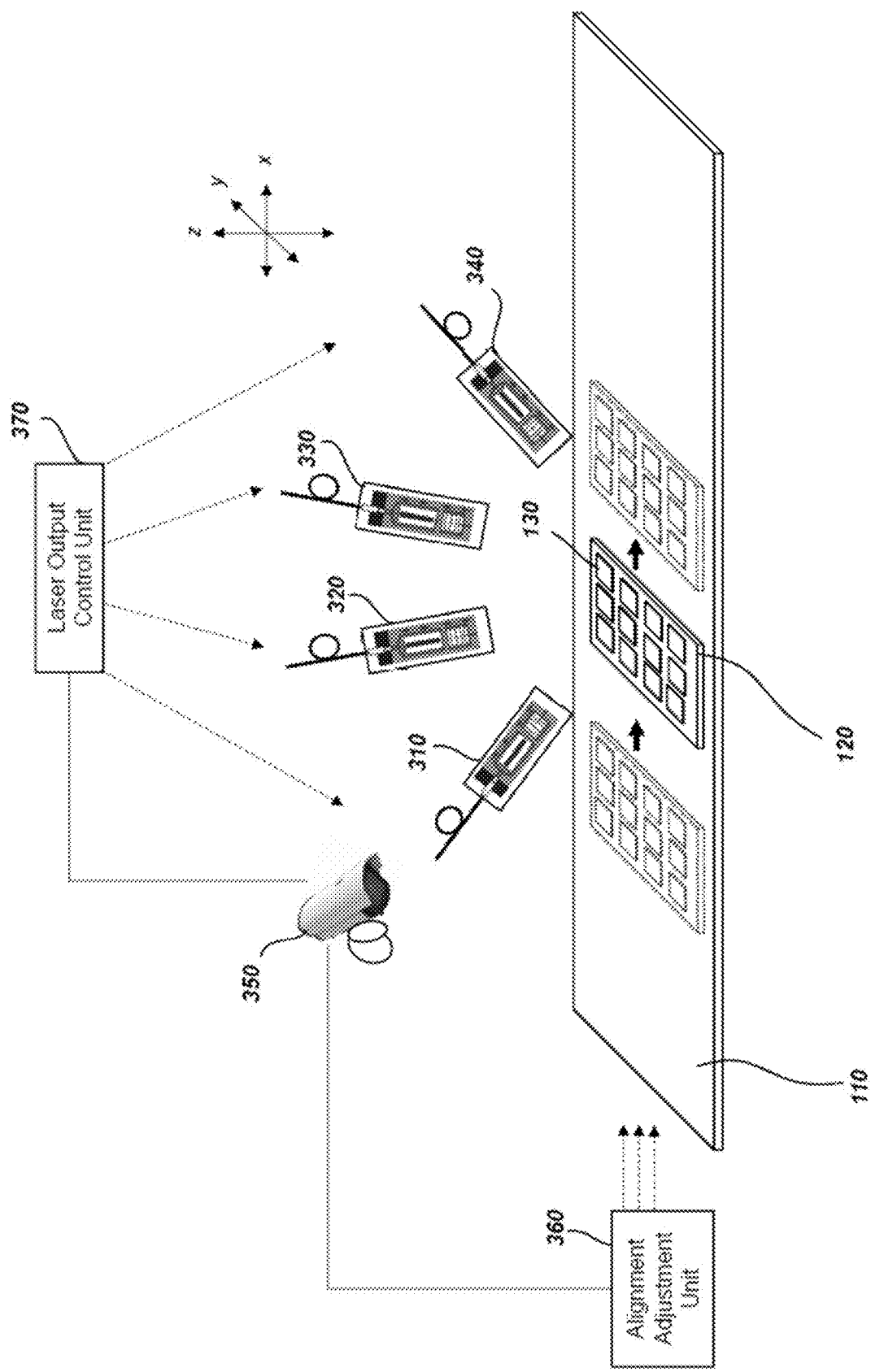
FIG. 3 is a view illustrating an example of a laser reflow apparatus according to an exemplary embodiment of the present disclosure.

FIG. 3 is a conceptual view illustrating a laser reflow apparatus according to an exemplary embodiment of the present disclosure.

Referring to FIG. 3, the laser reflow apparatus is configured to bond an electronic component (130) using a plurality of laser beams from a laser emission unit including a plurality of laser modules (310 to 340) to a substrate (120) disposed on a stage (110) which moves in the X axis direction.

An alignment state of the substrate (120) on which an electronic component (130), such as a semiconductor chip, is mounted is verified from an image captured by a camera unit (350) comprised of one or more camera modules. In case of misalignment, a realignment is performed by an alignment adjustment unit (360) which moves the stage (110) in the X axis or Y axis direction.

The laser reflow apparatus of FIG. 3 may include a multi-beam multi-optic (MBMO) laser emission unit comprised of a plurality of laser modules (310, 320, 330, 340), each of which includes a laser source and an optical system. Each laser module may include a low-output laser source and a corresponding optical system simple in structure and small in size, which can be provided in an overall simple structure and at low costs. In addition, the laser source and the optical system may include a low-capacity cooling device (not shown).

When reflowing a substrate (120) having a large area on which multiple electronic components (130) are arranged, the respective laser modules (310 to 340) may simultaneously operate so that laser beams are emitted and superposed with one another throughout the entire area of the substrate (120), or the laser beams may be selectively emitted to only a portion (indicated in red) of the substrate (120).

Such a selective laser reflowing process allows for a laser beam to be emitted only to an electronic component (130) that needs reflowing, thereby preventing thermal conduction toward a region adjacent to each electronic component. Furthermore, since the thermal energy transmitted to respective portions of the substrate (120) can be precisely controlled, a temperature deviation can be maintained at a low level throughout the entire substrate (120).

A reflowing state of each electronic component (130) is captured by the camera unit (350). A laser output control unit (370) generates a control signal for individually controlling the output and the location of the respective laser emission units (310 to 340) by reading the captured image.

The laser reflow apparatus of FIG. 3 may emit laser beams at different angles. The plurality of laser emission units may include two or more low-output laser modules that can be geometrically arranged so as to maintain symmetry between them. With the symmetrical arrangement of the laser modules, even if the respective laser beams are emitted to an emission surface at an inclined angle, the respective laser beams emitted to the emission surface may interfere in a complementary manner, which in turn offsets or solves asymmetry occurring due to the inclination of the laser beam.

The high-output laser module having a single-beam, single-optic (SBSO) structure of FIG. 2 according to related art, for example, a laser reflow apparatus including a laser module of 10 kW, actually shows a ripple with the peak amplitude of 800 W, which is approximately 8% of the maximum output. Thus, the output of only 9 kW, which is approximately 90% of the maximum output except for the peak amplitude of 800 W, is used in the actual reflowing process. Therefore, despite the energy loss of about 10%, there is no other way but to use such a laser module of 10 kW.

Figure 4:
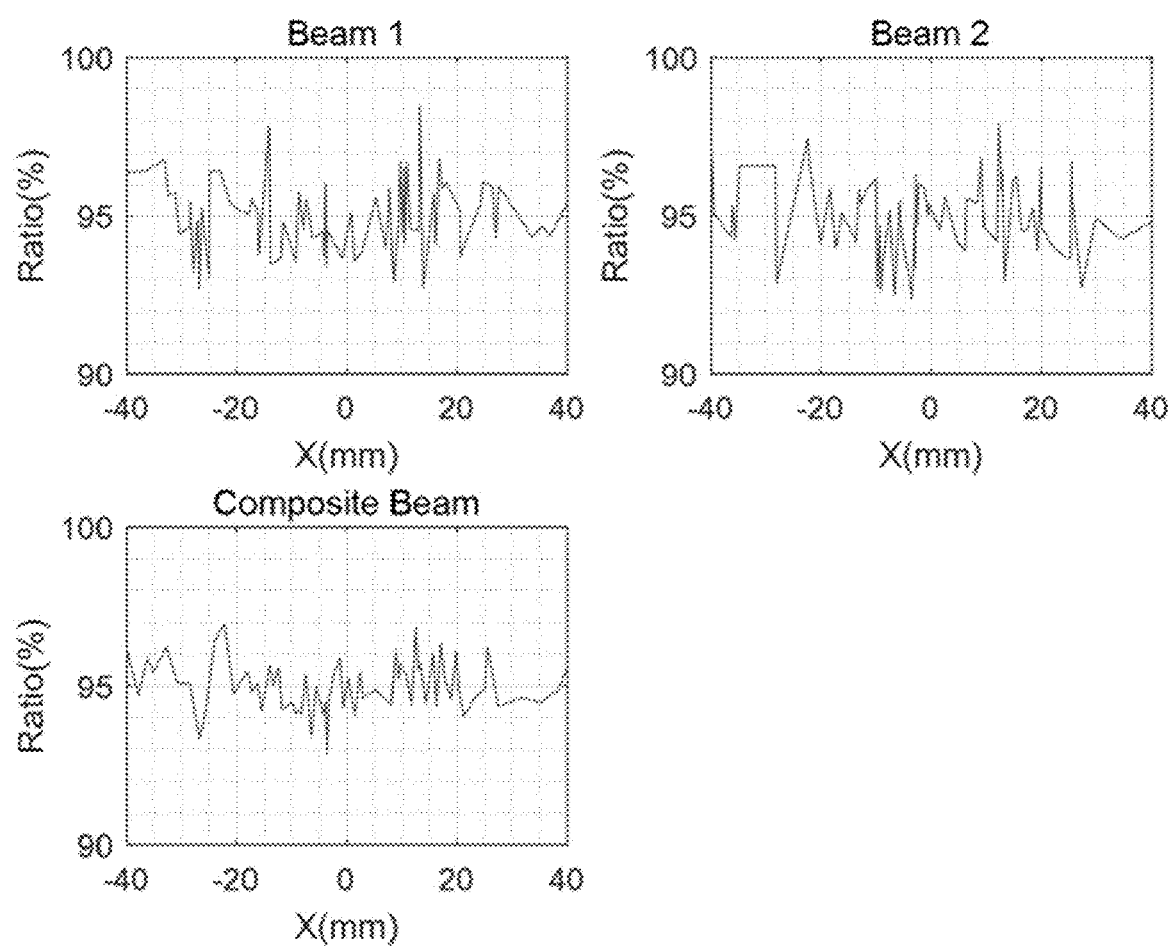
FIG. 4 is a view illustrating an example of a laser beam output profile of a laser reflow apparatus according to an exemplary embodiment of the present disclosure.

However, a laser reflow apparatus having a multi-beam, multi-optic (MBMO), which includes a plurality of low-output laser modules as shown in FIG. 4, for example, a laser reflow apparatus of a total of 10 Kw obtained by two laser modules of 5 kW, the peak of the ripple decreases to 6%

(based on 5 kW) due to a low output of each laser module. Upon superposition of the respective laser beams, the peak ripple would decrease to 4% (based on 10 kW) due to offset interference between the laser beams, such that a total laser beam output is consistently maintained above the level of 9.3 kW or more, which in turns produces the effect of improving the energy efficiency by approximately 3%. In this instance, depending on the design and the settings of the superposition of multi-beams, a laser beam peak ripple can be improved considerably more than the levels given as examples.

By using the aforesaid feature as an advantage, it may be possible to enhance energy efficiency by using a number of small-capacity, low-output laser modules.

Figure 5:
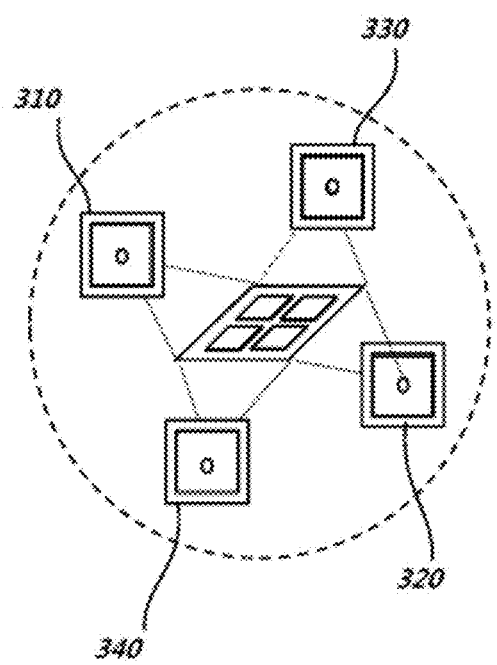
FIG. 5 is a conceptual view illustrating a laser superposition mode of a laser reflow apparatus according to an exemplary embodiment of the present disclosure.

FIG. 5 is a conceptual view illustrating a laser superposition mode of a laser reflow apparatus according to an exemplary embodiment of the present disclosure.

Referring to FIG. 5, respective laser beams output from a plurality of laser modules may be provided in a square, rectangular, circular, or elliptical shape, etc. For example, an aspect ratio of the laser beam is a short axis/long axis ratio of 1/20 or greater and 1/1 or less. If the aspect ratio is less than 1/20, linear beam characteristics of the laser beam are dominant. Thus, it cannot serve as an area beam in terms of the energy transmission and heat radiation of the absorbed heat. Furthermore, 1/1 is a maximum value in theory.

FIG. 5 illustrates an example of four laser modules (310 to 340) arranged in a symmetrical manner to simultaneously reflow a plurality of electronic components by emitting square laser beams of an equal output to superpose the respective laser beams on the same emission surface. Although FIG. 5 shows only four electronic components by way of example, as the number of electronic components arranged on the substrate having a large area, such as a large wafer having tens or hundreds of semiconductor chips disposed thereon, increases, the effects of superposition would be intensified.

Figure 6:
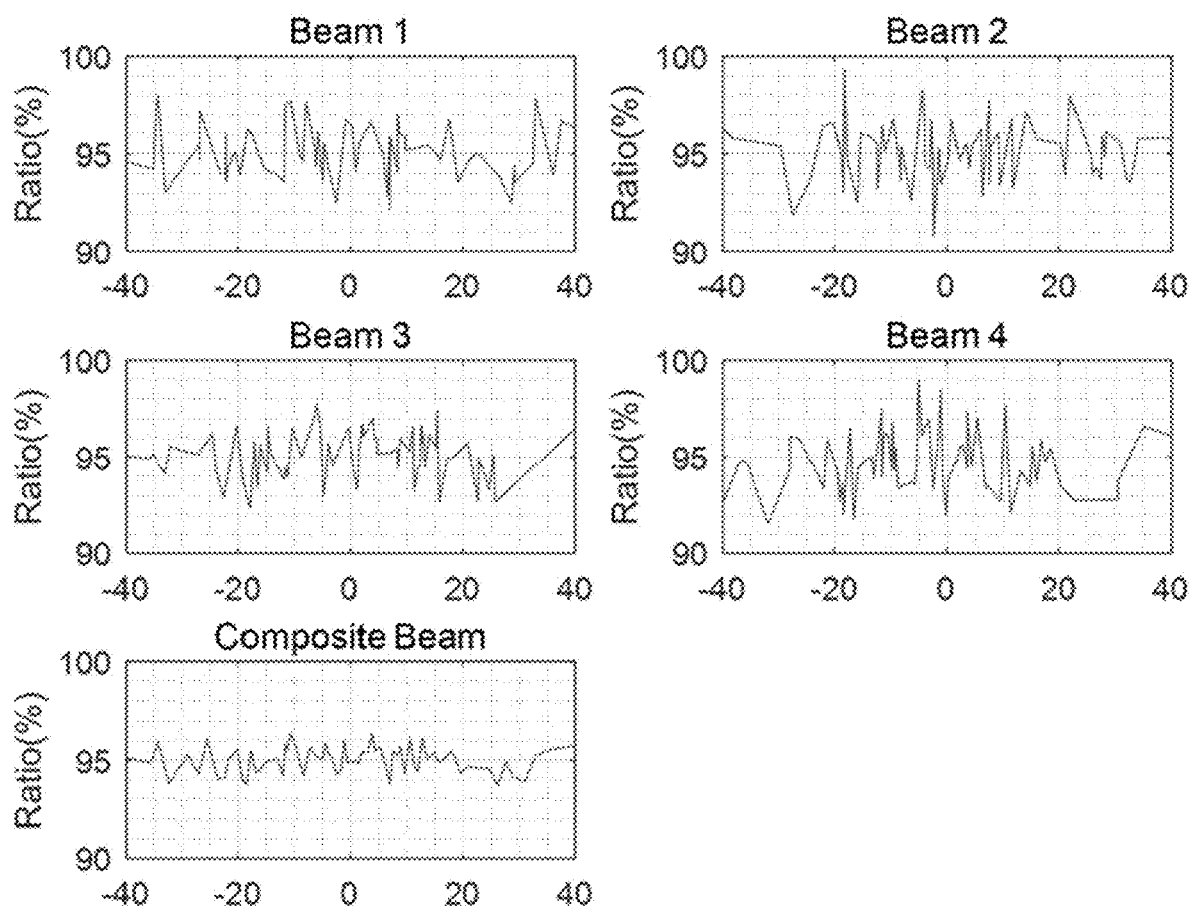
FIG. 6 is a view illustrating an example of a laser beam output profile during the superposition of four laser beams in a laser superposition mode according to an exemplary embodiment of the present disclosure.
Figure 7:
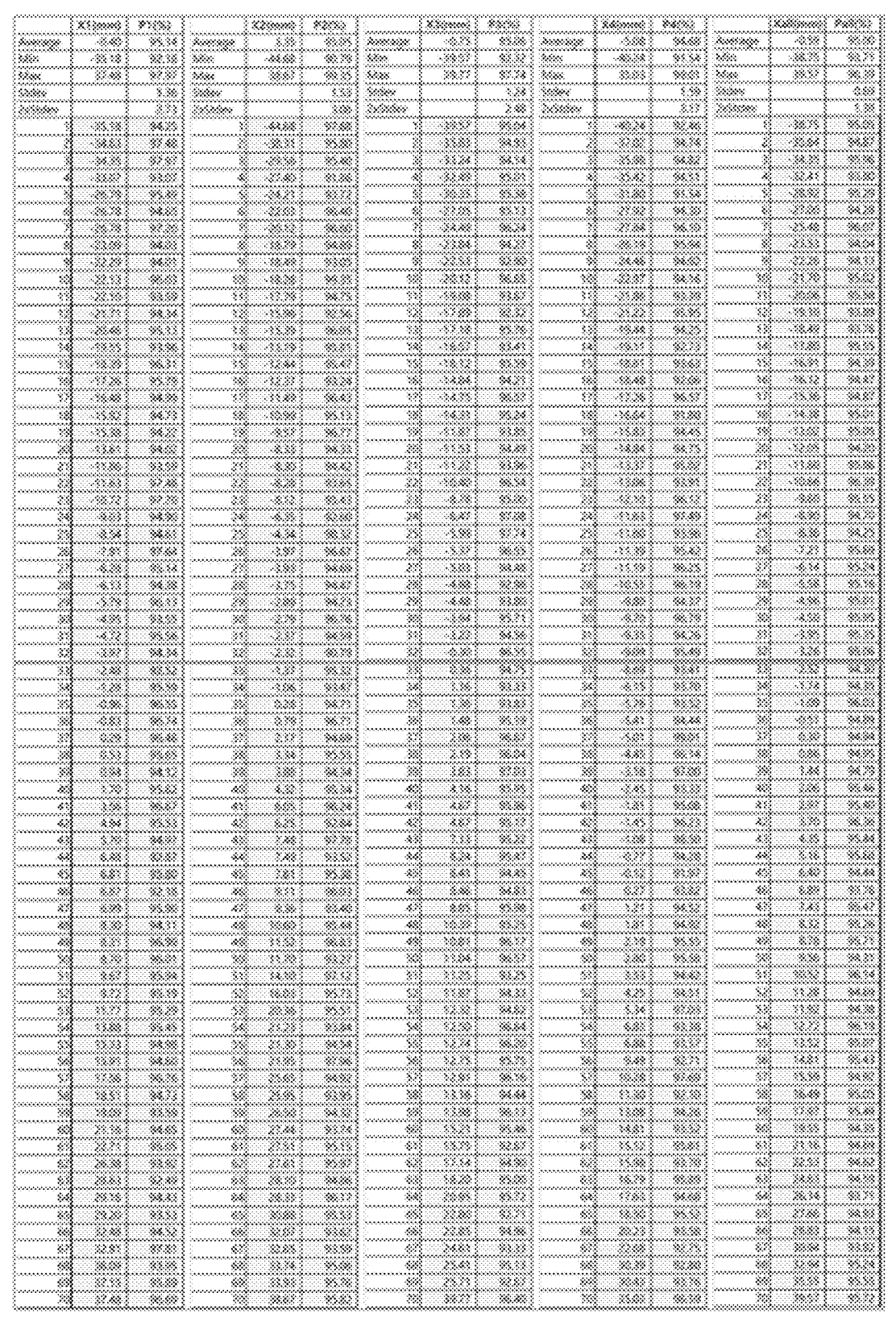

FIG. 6 is a view illustrating an example of a laser beam output profile during the superposition of four laser beams in a laser superposition mode according to an exemplary embodiment of the present disclosure. FIG. 7 is a table showing the results of a laser beam output test corresponding to the laser beam output profile of FIG. 6.

Referring to FIG. 7, a measured location (X) and a percentage output value (P) on the location for each of Beams 1, 2, 3 and 4 of FIG. 6 are provided.

If an output of each of the laser beams of FIG. 6 is 2.5 kW, an overall output value throughout the entire emission section (approximately 80 mm) has an average deviation in the range of 1.24 to 1.59%, although there may be some deviations for each laser beam. When the laser beams are superposed, the average deviation of the output values in the same section is reduced to 0.69%.

Accordingly, the peak ripple would be 5.79%, 8.56%, 5.42%, 7.47%, thus decreasing to an average of 6.81% (based on 2.5 kW) due to a low output of the respective laser modules. Moreover, when the respective laser beams are superposed, the peak ripple are further reduced to 2.68% (based on 10 kW) due to offset interference between the laser beams, thereby consistently maintaining the overall laser beam output at 9.35 kW or greater, and enhancing the energy efficiency by about 3.5%.

When using the four low-output laser emission units, beam flatness would approximate to 2.5%, which is close to the specifics of temperature stability required for a mass-reflow chamber, and thus, significantly superior in terms of utility. Specifically, as the laser beams emitted from the respective laser modules are randomly superposed on the emission surface, the beam flatness could be improved in proportion to the number of area beams being emitted from the plurality of low-output laser emission units and superposed.

To precisely control the offset effects without the reinforcement effects by the superposition of the laser beams, the outputs of a single laser source need to be distributed, and for each location, it is most efficient to create fluctuations of different beam intensities to thereby provide flat superposition of the laser beams. Meanwhile, however, even if laser beams having different wavelengths and fluctuations are superposed on the same emission surface, local weak heating by local unflatness (or peak rising) averaging superposition would not be a problem due to the thermal conduction effects on the electronic components and the substrate.

Figure 8:
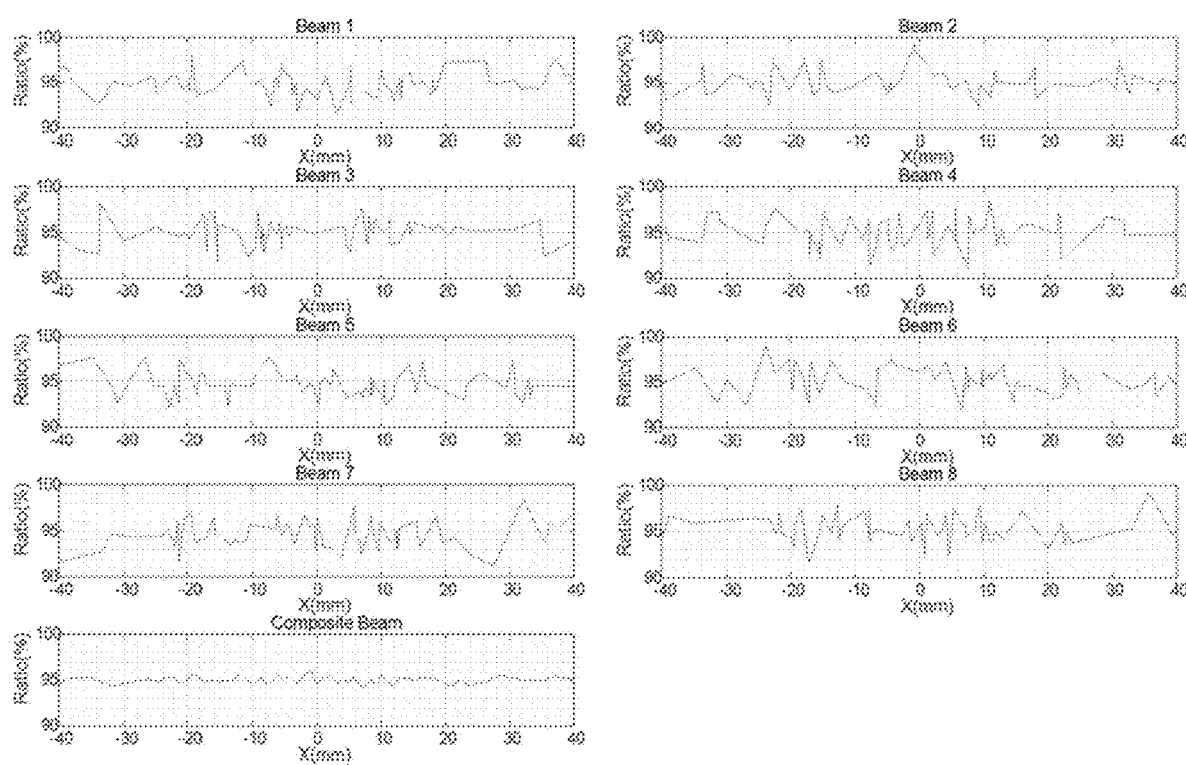
FIG. 8 is a view illustrating an example of a laser beam output profile during the superposition of eight laser beams in the laser superposition mode according to an exemplary embodiment of the present disclosure.
Figure 9:
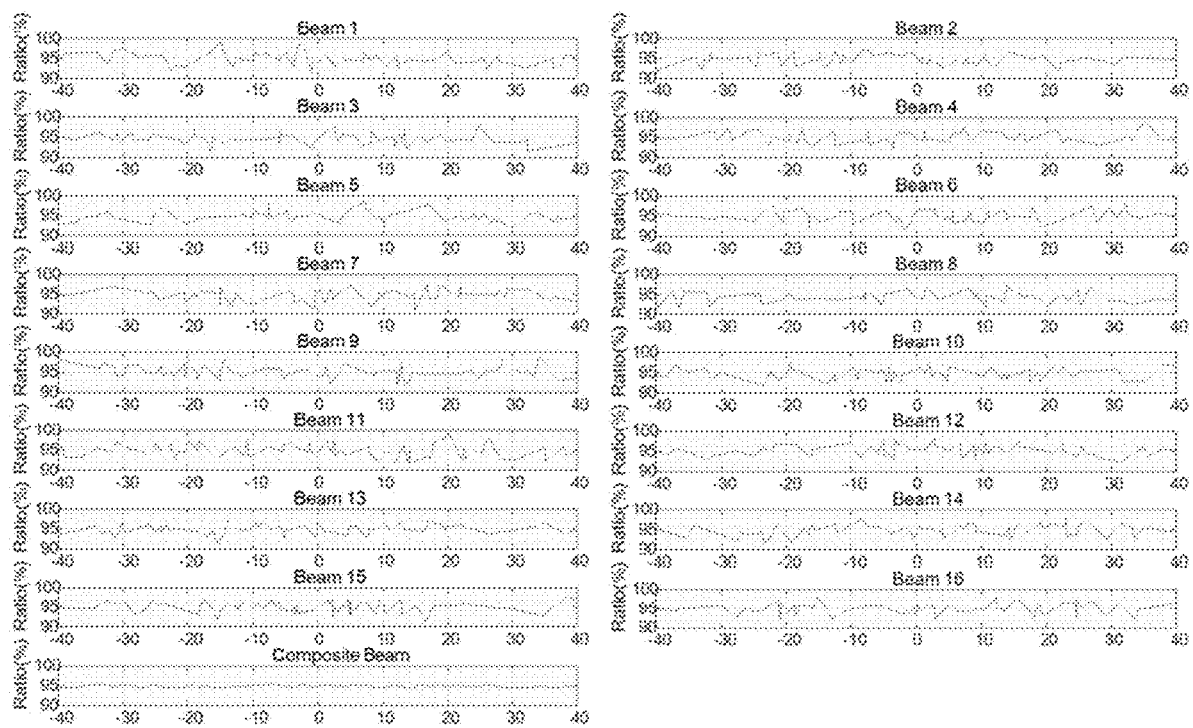
FIG. 9 is a view illustrating an example of a laser beam output profile during the superposition of 16 laser beams in the laser superposition mode according to an exemplary embodiment of the present disclosure.

FIG. 8 is a view illustrating an example of a laser beam output profile during the superposition of eight laser beams in the laser superposition mode according to an exemplary embodiment of the present disclosure. FIG. 9 is a view illustrating an example of a laser beam output profile during the superposition of 16 laser beams in the laser superposition mode according to an exemplary embodiment of the present disclosure.

To compare the superposition effects based on the number of small-capacity, low-output laser beams with respect to an equal output, an output profile of FIG. 8 including eight small-capacity laser beams (each having an output of 1.25 kW) is compared with an output profile of FIG. 9 including 16 small-capacity laser beams (each having an output of 625 W), in the case of superposing the eight laser beams of FIG. 8, the ripple decreases below 2% and the output of the superposed laser beam is invariably maintained at 94%, i.e., 9.4 kW or greater. Meanwhile, in the case of superposing the 16 laser beams of FIG. 9, the ripple decreases below 1.4% and the output of the superposed laser beam is invariably maintained at 94.3%, i.e., 9.43 kW or greater.

In view of this, it is verified that the beam flatness is improved as the number of laser beams increases, and as the minimum output increases, the overall energy efficiency is improved. However, while the beam flatness and energy efficiency according to the number of laser beams are remarkably improved in the case of superposing less than eight laser beams, as the number of laser beams increase, improvements in the beam flatness and energy efficiency with regard to an increase in structural complexity are not significant.

However, the results above are based on the overall output of 10 kW, and thus, in the case of different total output or different types of laser sources, or the like, different results would ensue. Accordingly, one of ordinary skill in the art could have derived an optimal number of laser beams suitable for respective conditions in consideration of the type of given laser source, the magnitude of required output, characteristics of emission object, etc. based on the principle of the present disclosure.

Figure 10:
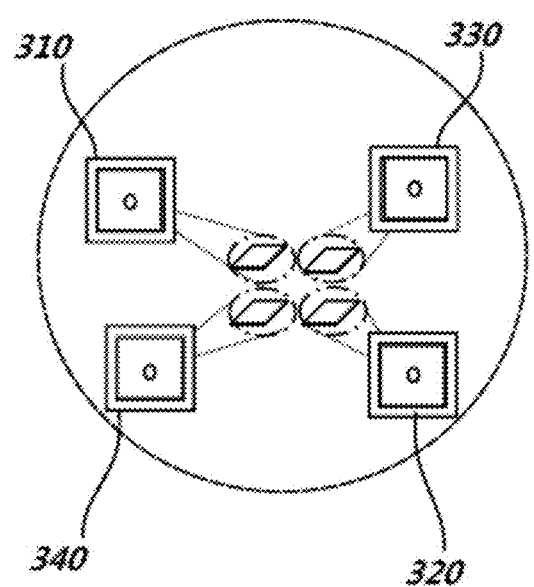
FIG. 10 is a conceptual view illustrating a simultaneous multi-location process mode of a laser reflow apparatus according to an exemplary embodiment of the present disclosure.

FIG. 10 is a conceptual view illustrating a simultaneous multi-location process mode of a laser reflow apparatus according to an exemplary embodiment of the present disclosure.

Referring to FIG. 10, laser beams output from a plurality of laser modules may be provided in a square, rectangular, circular, or elliptical shape, etc. For example, an aspect ratio of the laser beam is measured, for example, by a short axis/long axis ratio, which is 1/20 or greater and 1/1 or less.

If the aspect ratio is less than 1/20, it cannot serve as an area beam in terms of energy transmission. Furthermore, 1/1 is a maximum value in theory.

FIG. 10 illustrates an example of four laser modules (310 to 340) arranged in a symmetrical or asymmetrical manner to reflow a plurality of electronic components individually or by dividing them into groups by emitting square laser beams of equal or different outputs to superpose the respective laser beams on the same emission surface.

In FIG. 10, the square section of the emission area may indicate each electronic component or a zone having multiple electronic components. In the case of electronic components of different types arranged according to each zone on a single substrate, laser beams of different outputs or different wavelengths are used to simultaneously reflow the electronic components on the entire substrate to thereby perform local reflowing. In this instance, if the superposition structure shown in FIG. 5 is applied to some zones of the electronic components, for example, the direction and the magnitude of the laser beams of the laser modules (320, 330) are controlled and arranged in a symmetrical manner so as to simultaneously emit the laser beams on the upper right section and the lower right section of the emission area shown in FIG. 10 to superpose the laser beams. In the upper right section and the lower right section of the emission area, where the superposition structure is applied, the superposition effects as set forth in reference to FIG. 5 may be anticipated.

Figure 11:
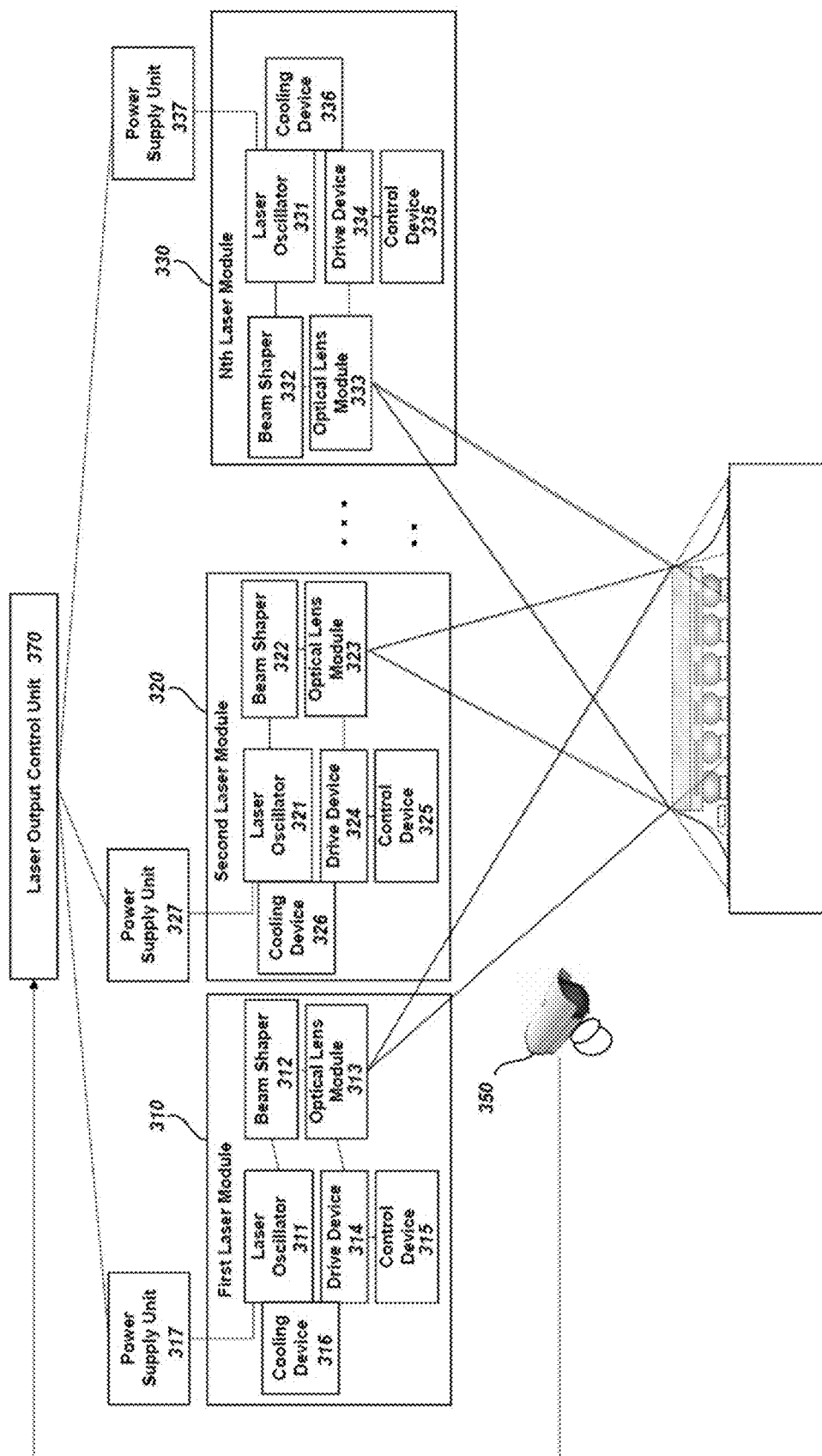
FIG. 11 is a configurational view illustrating a laser reflow apparatus according to an exemplary embodiment of the present disclosure.

FIG. 11 is a configurational view illustrating a laser reflow apparatus according to an exemplary embodiment of the present disclosure.

Referring to FIG. 11, respective laser modules (310, 320, 330) of a laser emission unit include laser oscillators (311, 321, 331) provided with cooling devices (316, 326, 336), beam shapers (312, 322, 332), optical lens modules (313, 323, 333), drive devices (314, 424, 334), control devices (315, 325, 335) and power supply units (317, 327, 337).

Hereinafter, descriptions of a first laser module (310) from among the respective laser modules, which have an identical configuration, are mainly provided to avoid overlapping descriptions, except where necessary.

The laser module (311) generates a laser beam having a wavelength and an output power in a predetermined range. The laser module may include a laser diode (LD), a rare-earth-doped fiber laser, or a rare-earth-doped crystal laser, having a wavelength, for example, in the range of 750 nm to 1200 nm, 1400 nm to 1600 nm, 1800 nm to 2200 nm, or 2500 nm to 3200 nm, respectively. Alternatively, the laser module may include a medium for emitting an Alexandrite laser light having a wavelength of 755 nm, or a medium for emitting an Nd:YAG laser light having a wavelength in the rage of 1064 nm or 1320 nm The beam shaper (312) converts the laser having a spot shape generated in the laser oscillator and transmitted through an optical fiber into an area beam having a flat top. The beam shaper (312) may include a square light pipe, a diffractive optical element (DOE) or a micro-lens array (MLA).

The optical lens module (313) is configured to emit the laser beam by adjusting the shape and magnitude of the laser beam converted into an area laser beam source by the beam shaper to electronic components mounted on a PCB substrate or to an emission zone. The optical lens module has an optical system comprised of a plurality of lenses. A detailed description of the optical system will be provided below with reference to FIGS. 12 to 15.

The drive device (314) is configured to move the distance and location of the laser module relative to an emission surface. The control device (315) is configured to control the drive device (314) to adjust the beam shape, the beam area, the beam sharpness and the beam emission angle upon incidence of the laser beam. The control device (315) can integrally control the respective operations of the laser module (310) in addition to the drive device (314).

A laser output control unit (370) is configured to control the amount of power supplied to respective modules from the power supply units (317, 327, 337) corresponding to the laser modules (310, 320, 330) according to a program received via a user interface or a predetermined program. The laser output control unit (370) receives regional or overall reflowing status information on the emission surface from at least one camera module (350), and controls the respective power supply units (317, 327, 337) based on the information. Alternatively, the control information from the laser output control unit (370) may be transmitted to the control devices (315, 325, 335) of the respective laser modules (310, 320, 330), and control devices (315, 325, 335) may provide a feedback signal for controlling the respectively corresponding power supply unit (317). Further, unlike in FIG. 11, a single power supply unit may distribute power to respective laser modules, and in such instance, the laser output control unit (370) needs to control the power supply unit.

Hereinafter, the operations of the laser output control unit (370) for performing the laser superposition mode of FIG. 5 and the simultaneous multi-location process mode of FIG. 10, or a parallel mode simultaneously applying both are described.

In the case of the laser superposition mode of FIG. 5, the laser output control unit (370) controls the respective laser modules (310, 320, 330) and the power supply units (317, 327, 337) so that the laser beams from the respective laser modules are equal in terms of beam shape, beam area, beam sharpness and beam emission angle.

In the case of dividing a single laser source to input in the respective laser modules, the laser output control unit (370) may have the function of simultaneously controlling the output and the phase of each of the divided laser beams. In such case, although the overall output is not reduced compared to the output in the case of using a single laser light according to related art, the laser output control unit beam can remarkably improve beam flatness by controlling the phase to induce the offset interference of the respective laser beams, thereby increasing the energy efficiency.

In the case of the simultaneous multi-location operation mode as shown in FIG. 10, the laser output control unit (370) controls one or more of the beam shape, beam area, beam sharpness, beam emission angle and beam wavelength so that a portion or entirety of the laser beam from the respective laser modules is different. Also, in the case of dividing a single laser source to input in the respective laser modules, the laser output control unit (370) may have the function of simultaneously controlling the output and the phase of each of the divided laser beams.

With this function, the magnitude and the output of the laser beam are controlled thereby performing bonding between electronic components on an emission surface to a substrate or remove bonding. For example, in the case of removing a damaged electronic component from a substrate, the area of the laser beam may be minimized to the area of the corresponding electronic component, so that the heat from the laser beam that is applied to a neighboring electronic component or a normal electronic component on the substrate may be minimized. Accordingly, only the damaged electronic component which is a removal target can be removed.

In the case of emitting laser beams having different wavelengths for each of the plurality of laser modules, the laser emission unit may include an individual laser module having a wavelength that can be easily absorbed by a plurality of material layers (e.g., EMC, silicone, solder) of an electronic component. Thus, the selective laser reflow system for electronic components having a micron-class thickness according to an exemplary embodiment of the present disclosure may perform an optimized attaching or bonding or detaching or de-bonding process by selectively differently increasing the temperature of the electronic component or the temperature of the intermediate bonding material such as a solder for connecting a PCT with an electronic component.

For example, the heat may be guided to be transmitted to the bonded portion at a lower portion of the electronic component by allowing all the energy of the respective laser beams to be absorbed on the solder layer by transmitting both an EMC mold layer and a silicon layer of the electronic component, or by heating the surface of the electronic component without transmitting the laser beam into the EMC mold layer.

Figure 12:
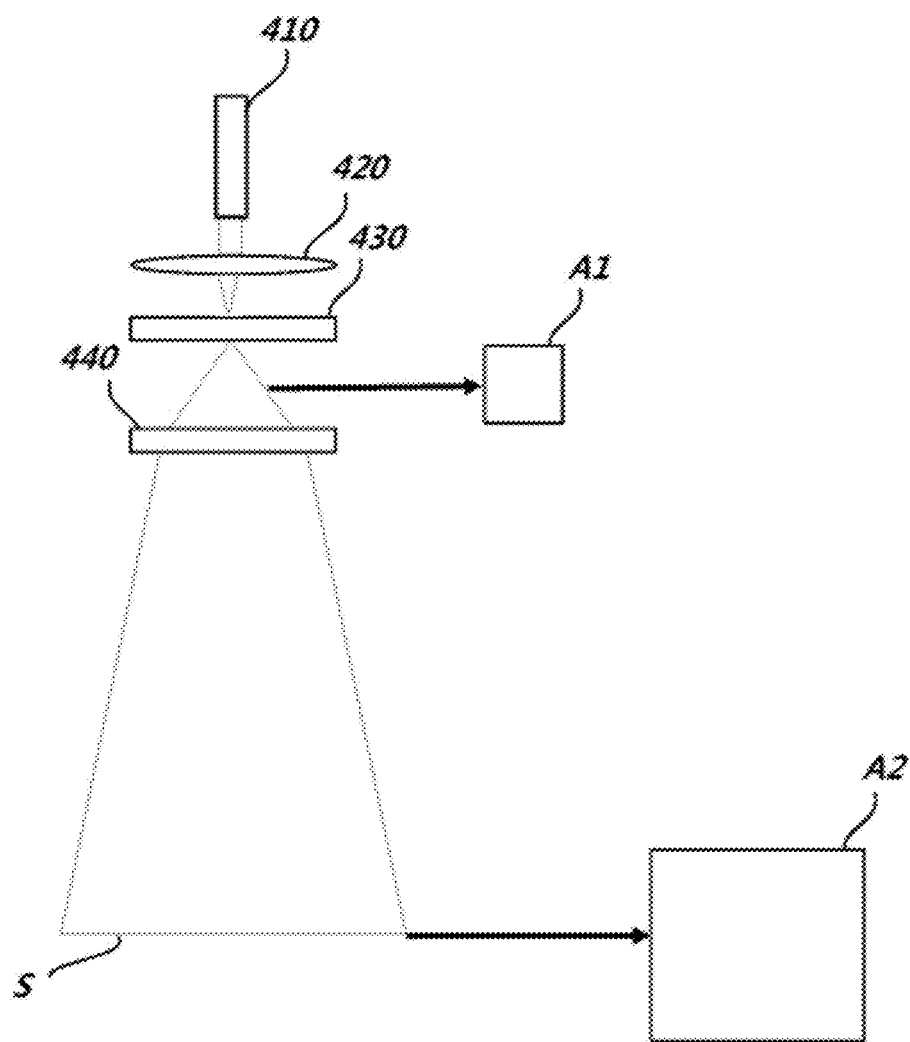
FIG. 12 is a configurational view illustrating an example of a laser optical system according to an exemplary embodiment of the present disclosure.

FIG. 12 is a view illustrating an example of an optical system applied to a laser module according to an exemplary embodiment of the present disclosure.

Referring to FIG. 12, the optical system shown is a simplest applicable structure. When a laser bean emitted from a beam transmission optical fiber (410) is focus-aligned through a convex lens (420) to be induced to a beam shaper (430), the beam shaper (430) converts the laser beam having a spot shape to an area light source (A1) having a flat top. The laser beam (A1) output from the beam shaper (430) is enlarged by a concave lens (440) to a desired size to be emitted on an imaging surface (S) in the form of an enlarged area light source (A2).

Figure 13:
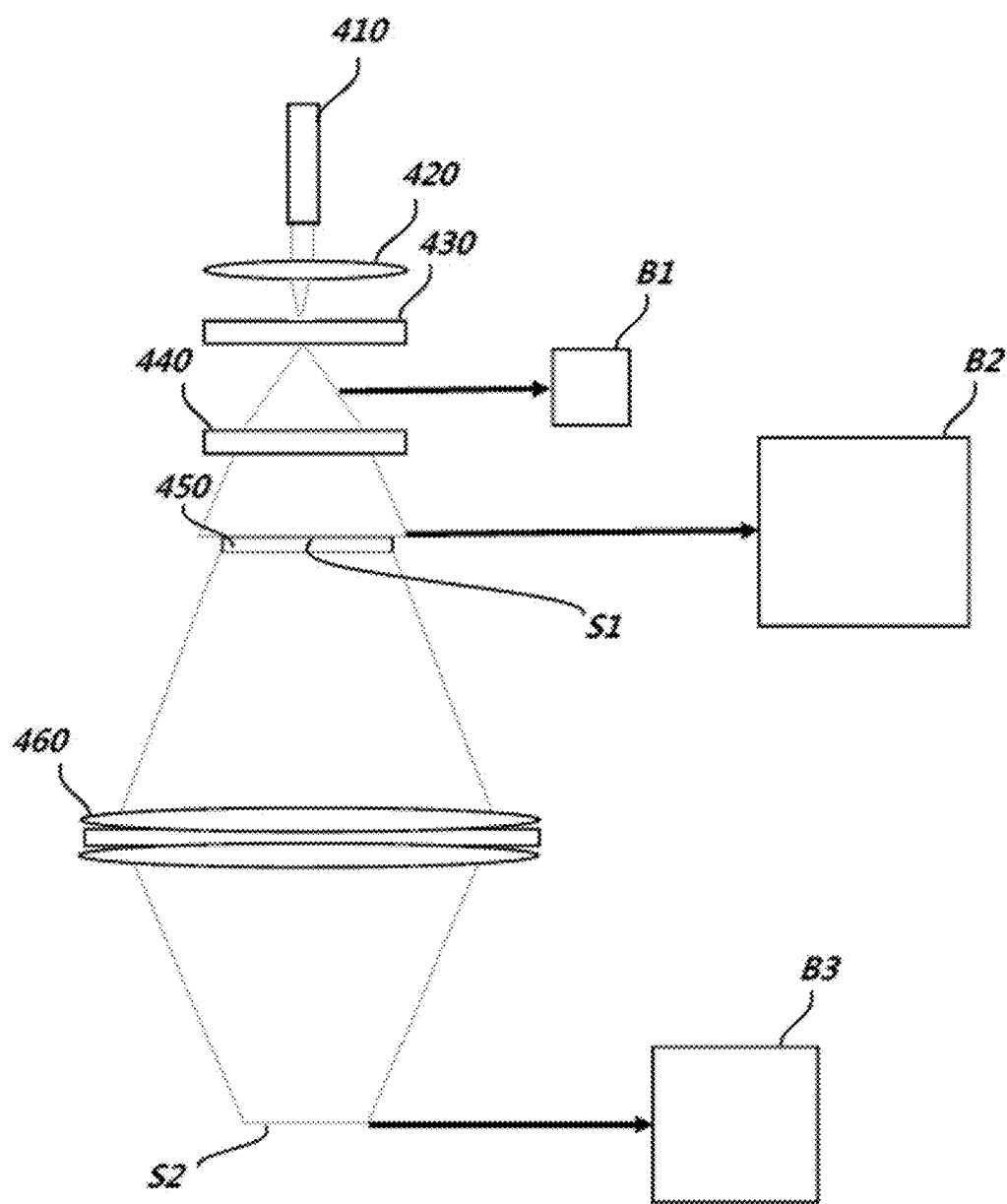
FIG. 13 is a configurational view illustrating another example of a laser optical system according to an exemplary embodiment of the present disclosure.

FIG. 13 is a configurational view illustrating an example of applying a mask to the optical system of FIG. 12.

An area light source (B1) from the beam shaper (430) is enlarged to a predetermined size by the concave lens (440) and emitted on a first imaging surface (S1) as an area light source (B2). If necessary, the area light source (B2) is further enlarged, in which case a boundary of the edge of the area light source (B2) may be blurred due to the additional enlargement. Thus, to obtain an emission light having a final emission surface with a clear edge on the second imaging surface (S2), a mask (450) is provided on the first imaging surface (S1) to trim the edge.

The area light source that has transmitted through the mask (450) is diminished (or enlarged) to a desired size while passing through a zoom lens module (460) comprised of one or more of convex lenses and concave lenses, to thereby form a square emission light (B3) on the second imaging surface (S2) on which electronic components are disposed.

Figure 14:
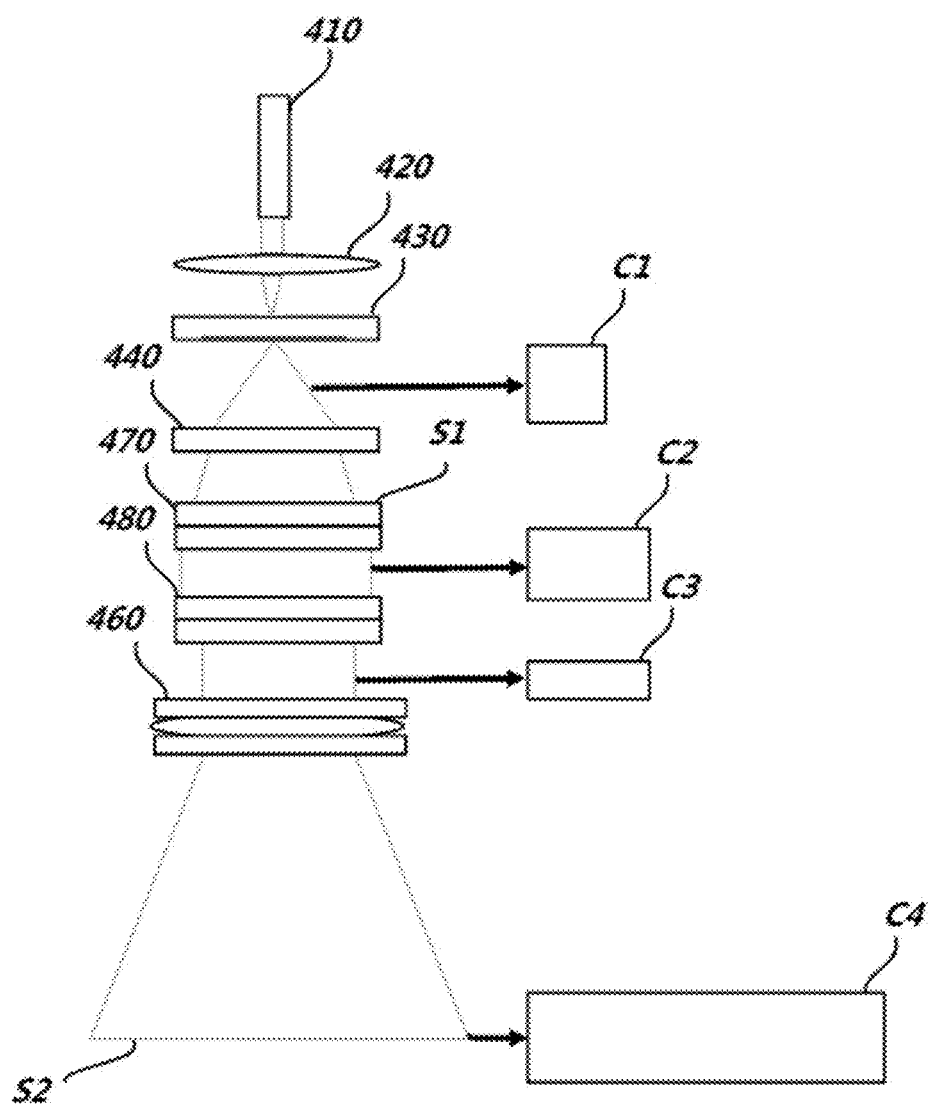
FIG. 14 is a configurational view illustrating still another example of a laser optical system according to an exemplary embodiment of the present disclosure.

FIG. 14 is a configurational view illustrating another example of an optical system applied to a laser module according to an exemplary embodiment of the present disclosure.

After a square area light source (C1) from the beam shaper (430) is enlarged to a predetermined size by the concave lens (440), the area light source (C1) is transmitted through at least one pair of cylindrical lenses (470) and is enlarged (or diminished), for example, in the X axis direction to become an area light source (C2). Further, as the area light source (C2) is transmitted through at least one pair of cylindrical lenses (480), it is enlarged (or diminished), for example, in the Y axis direction to become a rectangular area light source (C3). The cylindrical lens being used has a shape of the cross-section of a cylinder cut in a longitudinal direction, and serves to enlarge or diminish a laser beam according to the arrangement of the respective lenses in a vertical direction. The cylindrical lens adjusts the laser beam in the X or Y direction according to the arrangement of the lenses on the surface on which the cylindrical lens is disposed.

The area light source (C3) passes through the zoom lens module (460) comprised of one or more convex lenses and concave lenses to be adjusted to a predetermined size through enlargement (or diminishing), thereby forming an emission light (C4) having a rectangular shape on the second imaging surface (S2) on which the electronic components are disposed.

Figure 15:
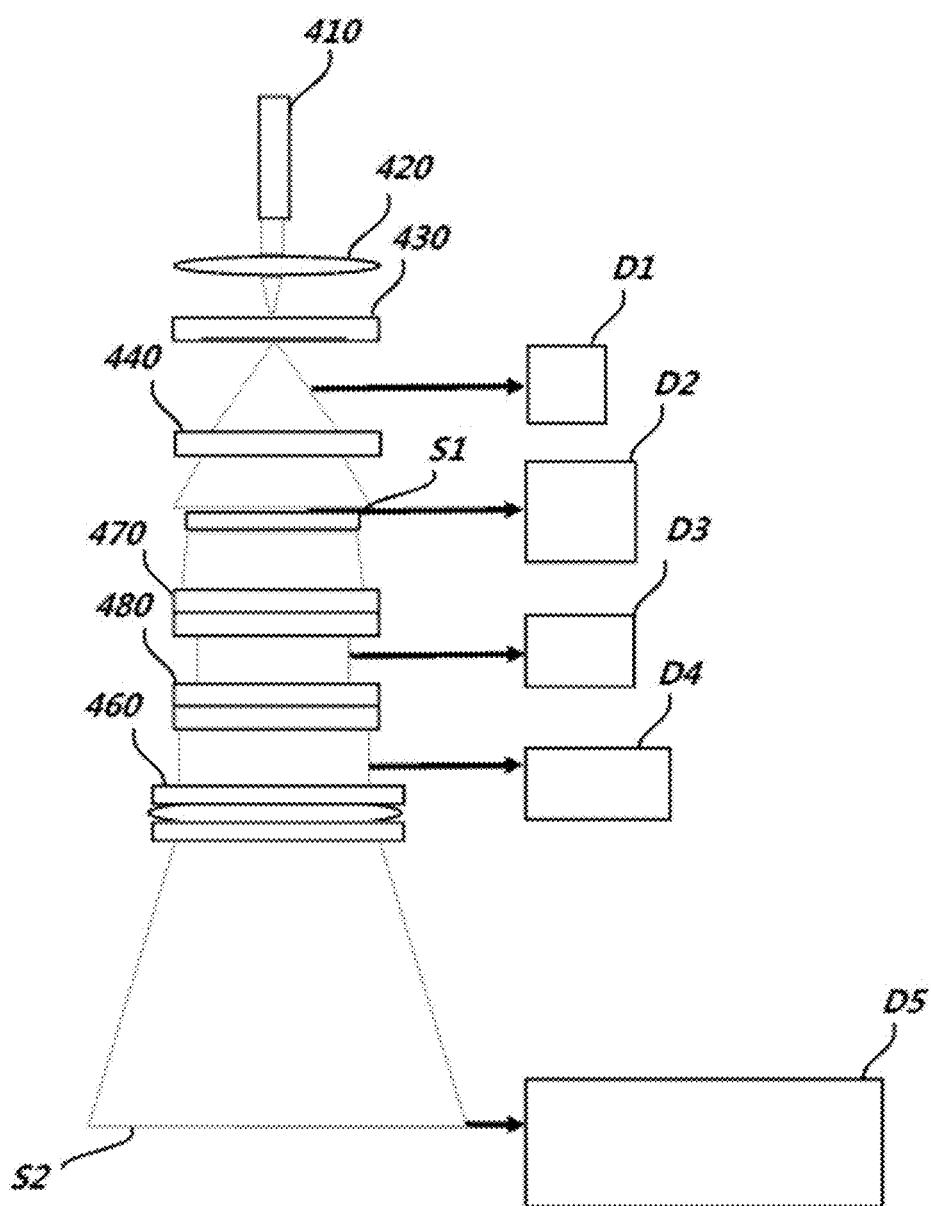
FIG. 15 is a configuration view illustrating yet another example of a laser optical system according to an exemplary embodiment of the present disclosure.

FIG. 15 is a configuration view illustrating a mask applied to the optical system of FIG. 14.

The optical system of FIG. 15 is the optical system of FIG. 14 having an additional feature trimming an edge of a laser beam is added by applying a mask to the optical system of FIG. 14. The optical system of FIG. 15 can obtain a final area light source (D5) having a clearer edge than in the optical system of FIG. 14.

Although exemplary embodiments of the present disclosure have been shown and described with reference to the accompanied drawings, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A laser reflow apparatus for reflowing electronic components on a substrate disposed on a stage, the apparatus comprising:
   a laser emission unit comprised of a plurality of laser modules for emitting a laser beam having a flat top output profile in at least one section of the substrate on which the electronic components are disposed; and
   a camera unit comprising at least one camera configured to capture a reflowing process of the electronic components performed by the laser beam,
   wherein each of the plurality of laser modules of the laser emission unit is configured to be independently controlled by a control signal, the control signal being generated based on a signal output from the camera and applied to the laser emission unit,
   wherein each of the plurality of laser modules has an equal maximum output, and is configured to emit a laser beam equal in beam shape, beam area and emission area,
   wherein the plurality of laser modules are arranged in a symmetrical manner each other about the at least one section of the substrate so that the laser beams emitted from the plurality of laser modules are superposed with one another on the at least one section of the substrate, and
   wherein the superposed laser beams provide flat superposition to improve flatness of the laser beams in terms of spatial beam intensity in a large portion of the emission area.

2. The apparatus according to claim 1, wherein each laser beam has an equal wavelength.

3. The apparatus according to claim 2, wherein the plurality of laser modules have an equal beam emission angle.

4. A laser reflow method for reflowing electronic components on a substrate disposed on a stage by using a laser emission unit comprised of a plurality of laser modules, the method comprising:
- emitting, by each of the plurality of laser modules, a laser beam to a section of the substrate on which the electronic components are disposed;
- capturing, by at least one camera, a reflowing process of the electronic components performed by the laser beam; and
- generating a control signal for independently controlling each of the plurality of laser modules of the laser emission unit based on a signal output from the camera and applying the control signal to the laser emission unit,
- wherein each of the laser modules has an equal maximum output, and emits a laser beam equal in beam shape, beam area and emission area,
- wherein the plurality of laser modules are arranged in a symmetrical manner each other about the section of the substrate so that the laser beams emitted from the plurality of laser modules are superposed with one another on the section of the substrate, and
- wherein the superposed laser beams provide flat superposition to improve flatness of the laser beams in terms of spatial beam intensity in a large portion of the emission area.

5. The method according to claim 4, wherein the emitting of a laser beam is performed with each laser beam having an equal wavelength.

* * * * *